United States Patent [19]
Kwan et al.

[11] Patent Number: 5,805,025
[45] Date of Patent: Sep. 8, 1998

[54] RADIAL ELECTRON-BEAM-BREAKUP TRANSIT-TIME OSCILLATOR

[75] Inventors: Thomas J. T. Kwan, Los Alamos; Michael A. Mostrom, Albuquerque, both of N. Mex.

[73] Assignee: The Regents of the University of California, Los Alamos, N. Mex.

[21] Appl. No.: 903,106

[22] Filed: Jul. 30, 1997

Related U.S. Application Data

[60] Provisional application No. 60/023,242, Aug. 9, 1996.
[51] Int. Cl.[6] .............................. H03B 9/01; H03B 13/00
[52] U.S. Cl. ............................................... 331/79; 331/104
[58] Field of Search ................................. 331/5–7, 79–84, 331/86–93, 104

[56] References Cited

U.S. PATENT DOCUMENTS 5,159,241  10/1992  Kato et al. .......................... 331/86 X

*Primary Examiner*—David Mis
*Attorney, Agent, or Firm*—Ray G. Wilson

[57] ABSTRACT

A radial electron-beam-breakup transit-time oscillator (RBTO) provides a compact high power microwave generator. The RBTO includes a coaxial vacuum transmission line having an outer conductor and an inner conductor. The inner conductor defines an annular cavity with dimensions effective to support an electromagnetic field in a $TEM_{00m}$ mode. A radial field emission cathode is formed on the outer conductor for providing an electron beam directed toward the annular cavity electrode. Microwave energy is then extracted from the annular cavity electrode.

12 Claims, 3 Drawing Sheets

RADIAL ELECTRON-BEAM-BREAKUP TRANSIT-TIME OSCILLATOR

This application claims the benefit of the priority date of U.S. Provisional application Ser. No. 60/023,242 filed Aug. 9, 1996.

BACKGROUND OF THE INVENTION

This invention relates to high power microwave generators, and, more particularly, to electron-beam-breakup transit-time oscillators for microwave generation. This invention was made with government support under Contract No. W-7405-ENG-36 awarded by the U.S. Department of Energy. The government has certain rights in the invention.

One new microwave generator is an axially driven electron-beam-breakup transit-time oscillator (ABTO), described in T. J. T. Kwan et al., "Electron Beam-Breakup Transition-Time Oscillator," 66 Phys. Rev. Lett., No. 24, pp. 3121–3124 (1991). Some advantages of the ABTO are that the high efficiency and growth rate of the microwave output decrease slowly with increasing voltage, the device is compact, and no external magnetic field is required. In spite of these advantages over other microwave devices, the ABTO is constrained to a beam impedance no lower than about 400 Ω. Therefore, to get high power, high voltage is required, which eliminates many possible applications. The ABTO device depends on the interaction of an axial electron beam with a $TM_{110}$ mode electromagnetic field in a cylindrical cavity. Thus, the interaction is inherently three-dimensional (3D), even without microwave extraction, and the beam is deflected sideways and lies in a plane containing the maximum axial electric field.

Accordingly, it is an object of the present invention to provide a low impedance electron-beam-breakup transit-time oscillator for microwave generation.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention may comprise a radial electron-beam-breakup transit-time oscillator. In a particular embodiment, the RBTO includes a coaxial vacuum transmission line having an outer conductor and an inner conductor. The inner conductor has end plates and an inner cylindrical surface defining an annular cavity with axial length and radial depth dimensions effective to support a cavity electromagnetic field in a $TEM_{00m}$ mode. A radial field emission cathode is formed on the outer conductor for providing an electron beam directed toward the annular cavity electrode.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

Figure 1:
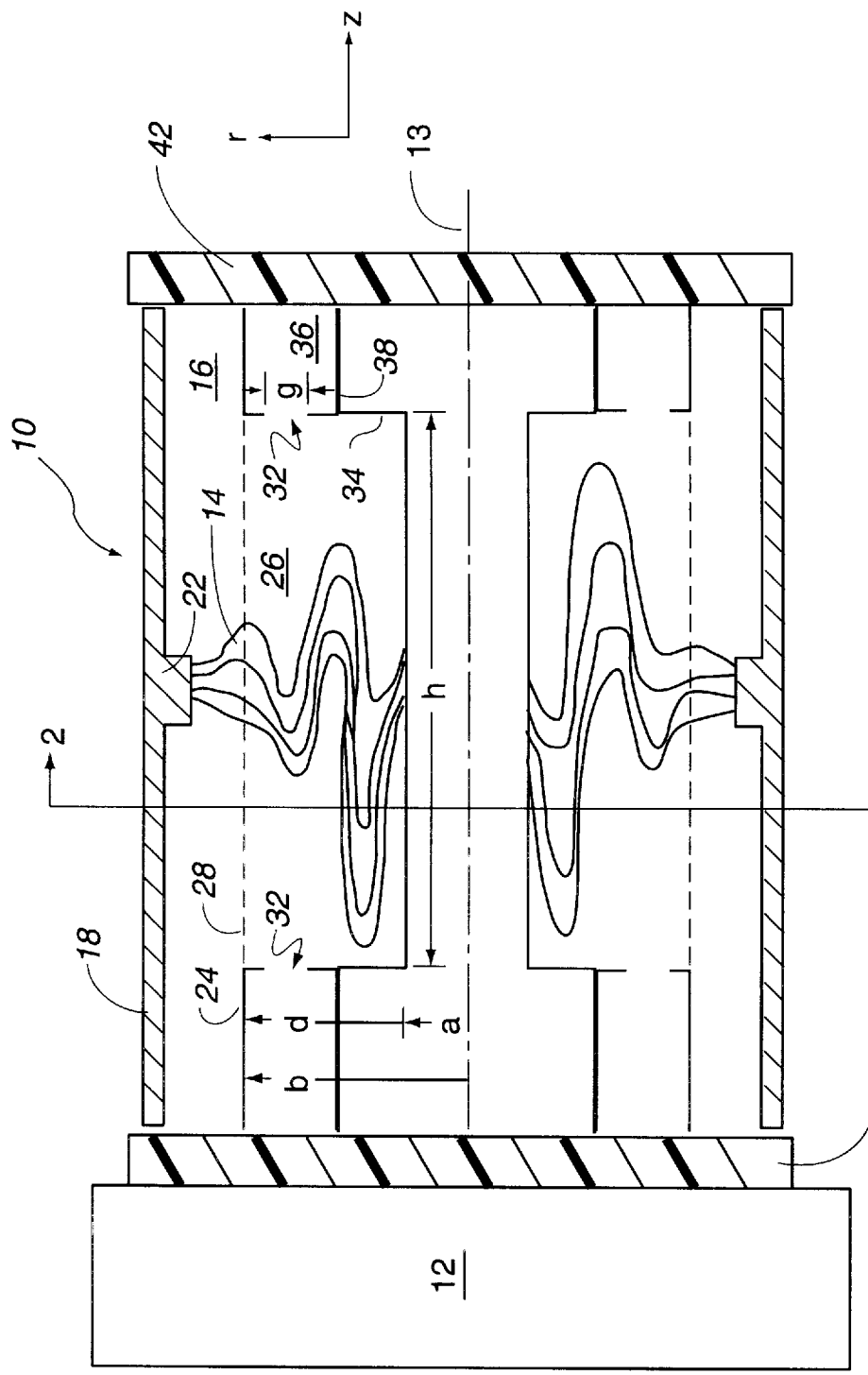
FIG. 1 is a side-view of a RBTO according to the present invention.
Figure 2:
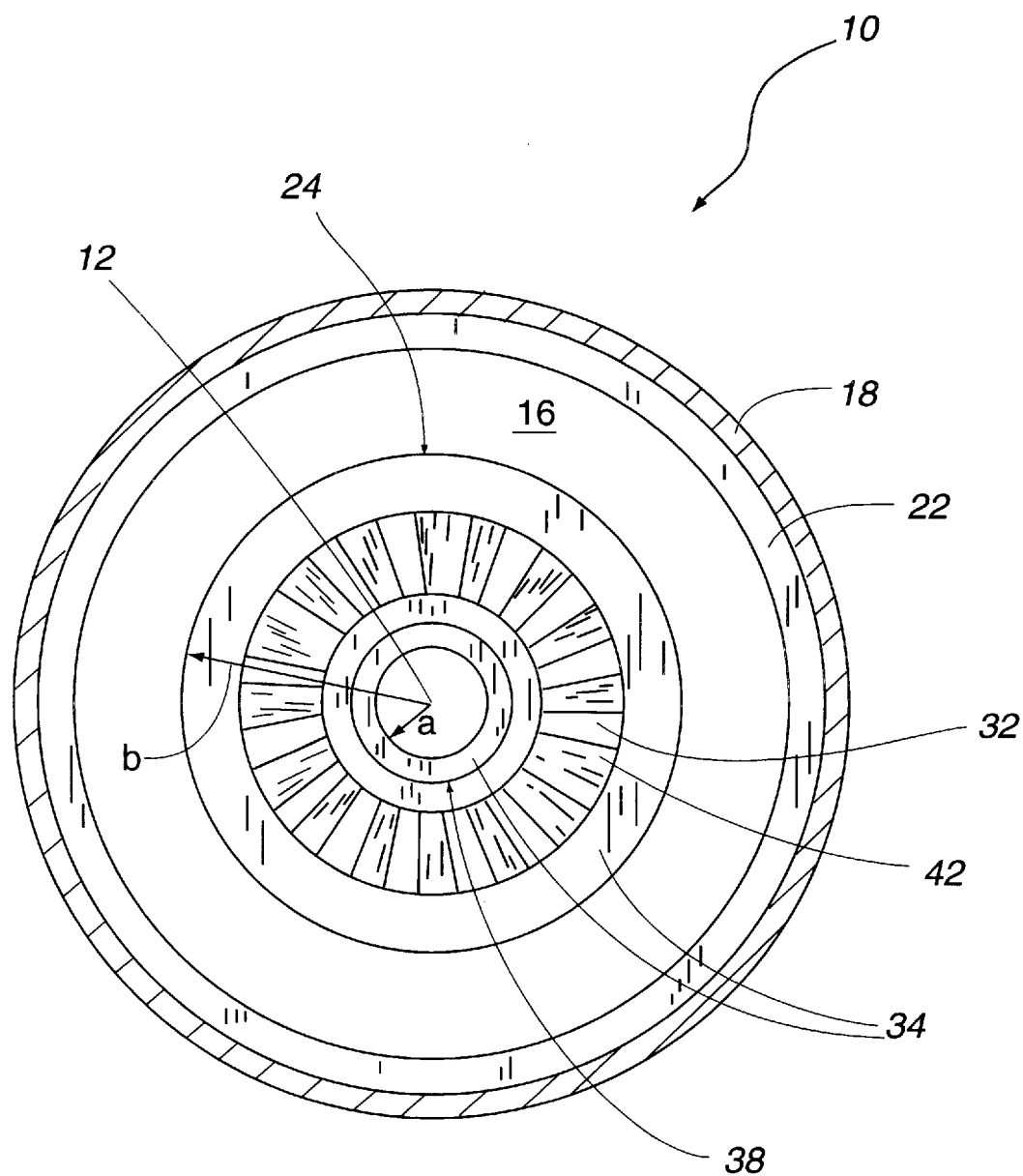
FIG. 2 is a cross-section through the RBTO shown in FIG. 1A.

Referring first to FIGS. 1 and 2, there is shown a radial electron-beam-breakup transit-time oscillator 10 (RBTO) according to one aspect of the present invention. Radially directed electron beam 14 is generated by radial field-emission cathode 22 in a coaxial vacuum transmission line 16 formed by cathode conductor 18 and anode conductor 24, with symmetric electromagnetic field 17 power feed from annular pulsed power supply 15 into cylindrical coaxial waveguide 12 and through dielectric 44 into annulus 16. Suitable pulsed power supplies, e.g., capacitor discharge devices or external feed devices, are described, e.g., in R. B. Miller, *An Introduction to the Physics of Intense Charged Particle Beams*, Chapter 1 (1987 Plenum Press, New York and London). Conductors 18 and 24 are supported at the ends by dielectric plates 44 and 42 that seal the vacuum/air interface. The output for the generated microwave radiation is an annular region of dielectric plates 42 and/or 44 between conductors 24 and 38 that is formed of a material that is transparent to the generated microwave radiation, e.g., plexiglass. Inner conductor 24 defines an outer radial boundary of annular cavity 26 that is axially aligned with cathode 22.

Electron beam 14 enters cavity 26 radially through screen region 28 in conductor 24. Beam 14 is then axially deflected like a rippled drum membrane by the electromagnetic field modes that are supported by cavity 26. RBTO 10 uses annular cavity 26 with a ribbon-like beam 14 fanning radially across cavity 26, with beam 14 deflected back and forth (along the z-axis direction of annular cavity 26) uniformly around annular cavity 26 in the θ direction. Because the motion is uniform in θ, the analysis can be done in two dimensions (2D).

An annular cavity can support a much larger space-charge-limited current than a cylindrical cavity, so that the beam impedance is greatly reduced. Thus, the RBTO has several advantages: (1) the 2D TEM microwave mode is readily analyzed and simulated; (2) the radial beam can carry 50 times more current and power than an axial beam (<10Ω impedance); (3) the high efficiency and growth rate decrease only slowly with increasing voltage; and (4) the device is compact and no external magnetic field is required. Advantages (3) and (4) are shared with the ABTO over conventional devices.

The growth rate and nonlinear saturation level of a microwave field and the space-charge-limited current of a radial electron beam have been simulated in an annular cavity. Simulations show reasonable agreement with the growth rate predictions and show extracted output power of 5 GW, or about 10% extraction efficiency. The saturation model predicts possible extraction efficiencies several times larger (up to 50%). Applications of high-power microwaves include high-average-current high-gradient accelerators, fusion plasma heating, materials processing, radar, and defense.

The preferred radial cavity fields for the RBTO are the $TEM_{00m}$ modes given by $E_r = (\Phi/r) \sin(m\pi z/h) \sin(\omega t - \phi)$, $B_\theta = (\Phi/cr) \cos(m\pi z/h) \cos(\omega t - \phi)$, where $\omega = m\pi c/h$, c is the speed of light, h is the axial length of the cavity, $\phi$ is an arbitrary phase angle, and $\Phi$ is an arbitrary mode amplitude. The mode number m corresponds to the number of half wavelengths of the mode axially across the cavity. The closest analogue to the ABTO device is the m=2 mode. The unperturbed beam travels radially across the cavity with velocity $v_r$, and at position $z_0 = h/2$ centered in the cavity. Note that h is the only length which sets the cavity frequency for this mode.

A small signal approximation is used for calculating the growth rate of the electromagnetic field amplitude. The single-particle perturbed axial acceleration of a beam electron is given by $$d^2z/dt^2 = -(e/\gamma m_e)v_r B_\theta \qquad \text{Eq. (1)}$$

where $\gamma = (1-\beta^2)^{-1/2}$, $\beta = |v/c|$, $m_e$ is the electron mass, and, for a radially-inward directed beam, the radial beam velocity $v_r$ is negative. Ignoring space-charge and nonlinear effects, or assuming a highly relativistic beam, $v_r$ may be treated as constant and the particle radial position is $r(t) = b - \beta ct$, where b is the radius of the beam at injection into the cavity. The beam travels radially across the cavity and is absorbed at radius $a = b - d$, where d is the radial depth of the cavity. Thus, a and b are the minimum and maximum radii of the cavity, respectively. Because the perturbed axial position is calculated to lowest order in $\Phi$, the RHS of Eq. (1) is evaluated at the unperturbed position $z_0 = h/2$. For convenience, several positive phase angles are defined: $\Theta \equiv \omega t$; $\Theta_d = \omega d/\beta c$; $\Theta_a \equiv \omega a/\beta c$; $\Theta_b \equiv \omega b/\beta c$; so that $\omega r(t)/\beta c = \Theta_b - \Theta$. Because $d^2z/dt^2 = \omega^2 d^2z/d\Theta^2$, and $\cos(m\pi z_0/h) = 1$, the equation of motion for the beam reduces to $$d^2z(\Theta)/d\Theta^2 = (e\Phi/\gamma m_e \omega c)\cos(\Theta - \phi)/(\Theta_b - \Theta), \qquad \text{Eq. (2)}$$

$$\zeta(\Theta) \equiv z(\Theta) - z_0 = \qquad \text{Eq. (3)}$$

$$(e\Phi/\gamma m_e \omega c) \int_0^\Theta d\Theta' \int_0^{\Theta'} d\Theta'' \cos(\Theta'' - \phi)/(\Theta_b - \Theta'').$$

In crossing the cavity, the particle looses energy $$m_e c^2 \Delta\gamma = -(e/\omega) \int_0^{\Theta_d} d\Theta\, v_r E_r(r(t), z(t)). \qquad \text{Eq. (4)}$$

To lowest order in $\Phi$, linearizing $\sin(m\pi\zeta/h)$ gives $$\Delta\gamma = \gamma^{-1}(e\Phi/m_e c^2)^2 \int_0^{\Theta_d} d\Theta \int_0^{\Theta} d\Theta' \int_0^{\Theta'} d\Theta'' \sin(\Theta - \qquad \text{Eq. (5)}$$

$$\phi)\cos(\Theta'' - \phi)/(\Theta_b - \Theta)(\Theta_b - \Theta'').$$

Averaging over an initial phase angle gives $$\langle\Delta\gamma\rangle = (1/2\gamma)(e\Phi/m_e c^2)^2 \int_0^{\Theta_d} d\Theta \int_0^{\Theta} d\Theta' \int_0^{\Theta'} d\Theta'' \sin(\Theta - \qquad \text{Eq. (6)}$$

$$\Theta'')/(\Theta_b - \Theta)(\Theta_b - \Theta'').$$

This can be integrated to give $$\langle\Delta\gamma\rangle = (A/2\gamma)(e\Phi/m_e c^2)^2 \qquad \text{Eq. (7)}$$

$$A \equiv (f(\Theta_b) - f(\Theta_a)) \sin\Theta_d + (g(\Theta_b) + g(\Theta_a))(1 - \cos\Theta_d).$$

The functions $f(z) \equiv Ci(z) \sin(z) - si(z) \cos(z)$ and $g(z) \equiv -Ci(z) \cos(z) - si(z) \sin(z)$ are defined in terms of Sine and Cosine integrals.

The power gained by the cavity fields due to this loss of energy by the beam particles is $$P = -\langle\Delta\gamma\rangle I_b m_e c^2/e = -\langle\Delta\gamma\rangle(v/c)(m_e c^3/e)^2,$$

where $I_b$ is the beam current and $v \equiv I_b/17$ kA is Budker's parameter. The cavity field energy is $$U = \Phi^2(h/4) \ln(b/a).$$

The cavity interaction Q is $Q_b = \omega U/P$, and the amplitude growth rate is $\omega_i/\omega = \frac{1}{2}Q_b - 1/Q_L$, or $$\omega_i/\omega = (Av/m\pi\gamma)/\ln(b/a) - \frac{1}{2}Q_L, \qquad \text{Eq. (8)}$$

where $Q_L$ is the loaded-cavity quality factor including wall losses and extraction openings. The threshold of the beam current for growth of the cavity mode is then $$v_c = (m\pi\gamma/2AQ_L)\ln(b/a). \qquad \text{Eq. (9)}$$

Repeating this calculation with $v_r$ positive and the beam going from a to b, and using the symmetry relations $f(-z) = -f(z)$ and $g(-z) = g(z)$, it is easy to show that the growth rate is independent of the beam direction if all other parameters are the same. But the electron beam direction does affect other operating parameters, as shown below.

Figure 3:
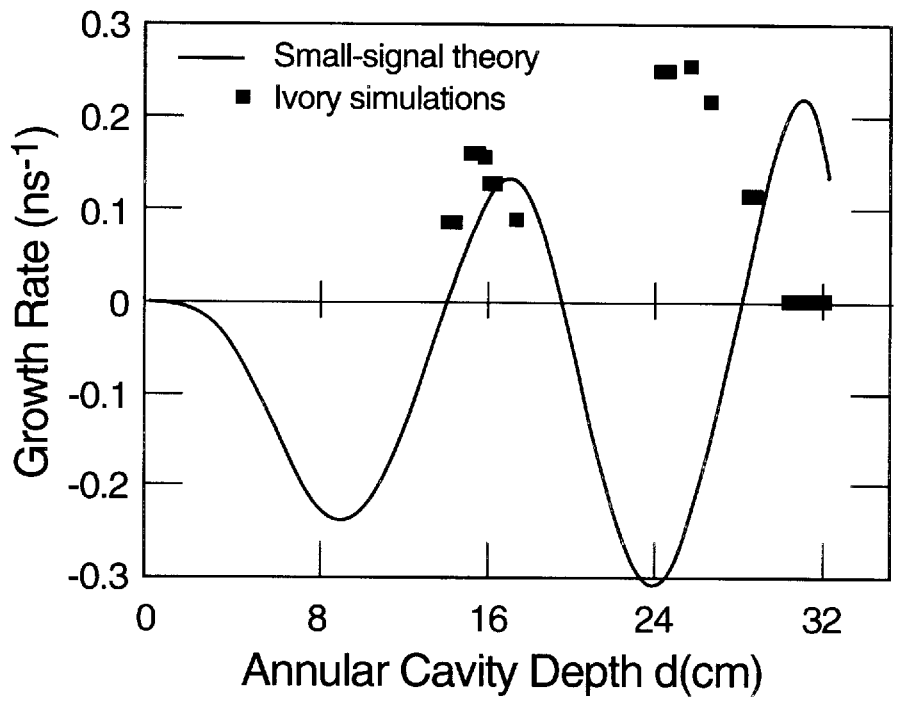
FIG. 3 graphically depicts the growth rate of a microwave field in the annular cavity of the RBTO for different cavity depths.

FIG. 3 graphically shows an example of how the growth rate depends on the annular depth $d = b - a$, for the case of an inward-directed beam of voltage 1 MV and current 50 kA, in a cavity of axial length h=15 cm and fixed outer radius b=35 cm, and mode m=2. The growth rate shows the expected transit-time resonances with increasing d, as in the ABTO, but here the range of variation of d is limited by the axis so only two growth-rate peaks are possible. As with the ABTO, space-charge depression of the beam velocity shifts the transit-time resonances to smaller values of d than shown by Eq. (8), which does not contain space-charge corrections. This effect becomes much more pronounced as the inner radius a approaches the axis, and the second growth-rate peak is almost 180° out of phase with the simple theory. Nevertheless, the magnitudes of the observed growth rates are in good agreement with the simple theory.

Taking the limiting case of the RBTO with a large radius, holding fixed the beam energy and current (i.e., $\gamma$ and $v$) and the cavity frequency and transit-time (i.e., the axial length h and the radial width d), the growth rate is then inversely proportional to radius. In this sense, the RBTO would have a lower growth rate than the ABTO. Fanning the beam out in the $\theta$ direction to form a radial beam crossing a large annular cavity reduces the local strength of the cavity fields and their ability to perturb the beam, and it also reduces the local density of the beam and its ability to generate cavity fields.

The advantage of the RBTO is that one does not have to hold constant the beam current. The annular cavity has a much higher space-charge-limited current, roughly proportional to radius, which makes the growth rate nearly the same if the space-charge limited current is injected into each device. For the ABTO, with a 2.55 MV beam having 5 kA of current, injected into a cylindrical cavity with length d=14.5 cm, radius 7.5 cm, and frequency 2.44 GHz, simulations showed a growth rate of 0.24 $ns^{-1}$ or $Q_b = 32$. For the RBTO with a similar frequency of 2.0 GHz, a simulation of the performance of the apparatus shown in FIG. 1 with inner radius a=10 cm (d=25 cm) showed a growth rate of 0.255 $ns^{-1}$ or $Q_b = 25$. Because the relative change in cavity energy per cycle is $\Delta U/U = 2\pi/Q$, roughly a quarter of the cavity energy is being regenerated each cycle. Alternatively, these devices support and can efficiently use a beam current large enough to drive a low $Q_L$ cavity, as shown in Eq. (9). With the optimum growth rate or Q nearly the same for the two devices, this makes the power and cavity energy nearly proportional to radius and the beam impedance inversely proportional to radius for the RBTO.

The same approach used by Genoni and Proctor (T. C. Genoni et al., 23 J. Plasma Phys., p. 129 (1980)) to determine an upper bound for the spacecharge-limited current of an annular axial electron is used for a radial electron beam. The analogue of the annular axial beam is a pair of radial beams injected symmetrically about the cavity center at $z=h/2$. If $z_1$ and $z_2$ are the axial bounds for one of these radial beams, such that the beam thickness is $\delta z \equiv z_2 - z_1$, the resulting upper bound on the current can be expressed as $$v_{ub} = b\delta z(k^2+\alpha^2)(\gamma^{2/3}-1)^{3/2}$$

where $\alpha$ is the solution to $$J_0(\alpha b)N_0(\alpha a) - J_0(\alpha a)N_0(\alpha b) = 0;$$

and k is the solution to $$(\alpha \tan h(a_3) \sin (a_1) - k \cos (a_1))(\alpha \cos (a_2) - k \tan h(a_4) \sin (a_2)) - (\alpha \tan h(a_3) \cos (a_1) + k \sin (a_1))(\alpha \sin (a_2) + k \tan h(a_4) \cos (a_2)) = 0.$$

where $a_1 = kz_1$, $a_2 = kz_2$, $a_3 = \alpha(z_1 - h/2)$, and $a_4 = \alpha(h - z_2)$. The relevant limiting case here for the RBTO is a merging of these two symmetric radial beams into a single thin radial beam centered axially in the cavity, $z_1 = h/2$, $z_2 = h/2 + \delta z$, $\delta z \ll h$, giving $$v_{ub} = b\alpha \coth(\alpha h/2)(\gamma^{2/3}-1)^{3/2}.$$

This gives a space-charge-limited current upper bound of 110 kA for standard exemplary simulation parameters: $h=15$ cm, $a=10$ cm, $b=35$ cm, and $V=1$ MeV.

Figure 4:
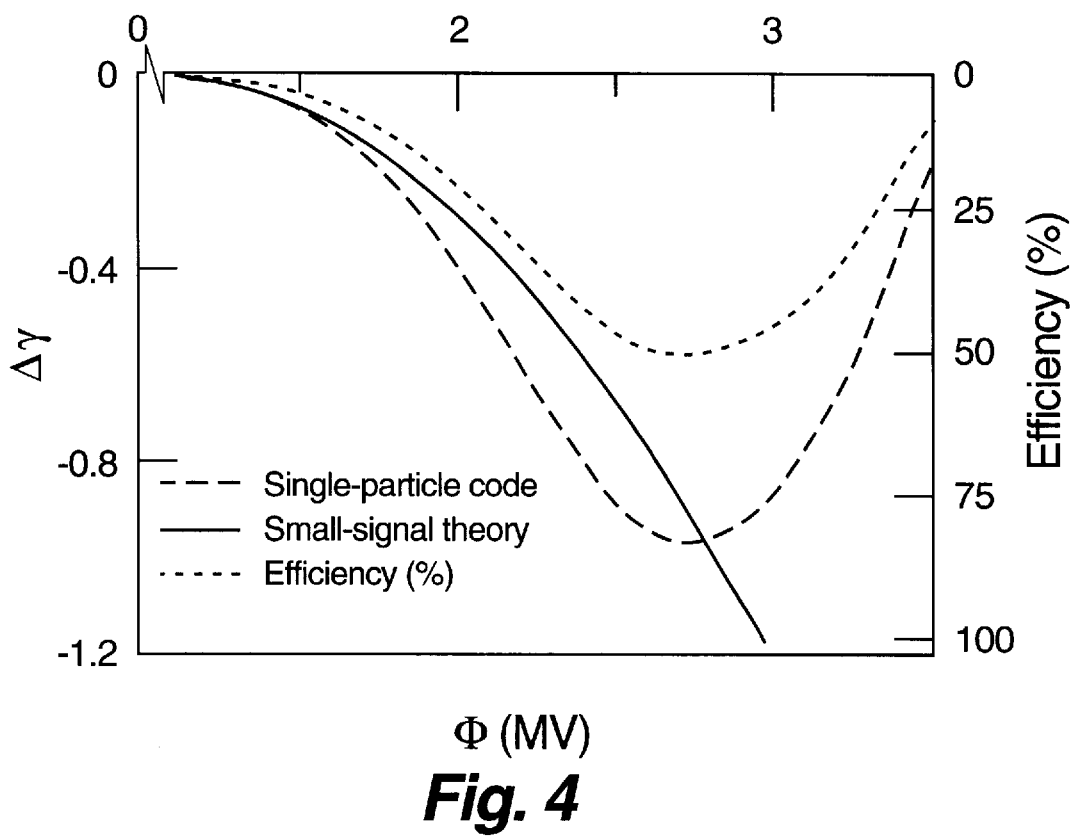
FIG. 4 graphically depicts beam particle energy loss vs. field amplitude at the second peak shown in FIG. 3.

To investigate nonlinear saturation, direct numerical integration was used, for one beam voltage of 1.0 MeV, of the single-particle equations of motion in the electromagnetic fields of the $TEM_{002}$ mode to determine the nonlinear energy loss $\Delta\gamma$ as the particle radially transverses the annular cavity. The numerical integrations were carried out at a series of mode amplitudes, $\Phi$, and the particle energy losses $\Delta\gamma$ were averaged over particle phase $\phi$. As shown in FIG. 4, for parameters corresponding to the second theory peak at $d=30.5$ cm in FIG. 3, $\Delta\gamma$ initially increases quadradically with $\Phi$, in agreement with Eq.(7), but eventually saturates at $\Phi_{sat}$ and then declines for $\Phi > \Phi_{sat}$. The predicted efficiency is defined as $-\Delta\gamma/(\gamma-1)$ evaluated at $\Phi_{sat}$.

Although the linear growth rate is the same for an inward-directed and an outward-directed radial beam, the nonlinear saturation is remarkably different. The first peak in the curve of growth rate versus d, shown in FIG. 3, occurs at $d=16.5$ cm. For an outward-directed radial beam, the predicted efficiency is only 7% at $\Phi_{sat}=3.2$ MV. However, for an inward-directed radial beam in the same cavity, the results are 32% efficiency at $\Phi_{sat}=5.7$ MV. This efficiency is comparable to the 35% efficiency found for the axial BTO. At the second peak, $d=30.5$ cm in FIG. 3, the predicted efficiency of the inward-directed radial beam increases to 51% at $\Phi_{sat}=2.6$ MV. This is shown in FIG. 4. For the same parameters, the efficiency of the outward-directed radial beam falls to less than 1% at $\Phi_{sat}=0.5$ MV.

For extraction simulations, the simulations concentrated on the radially-inward beam at the second growth rate peak. The value of $d=30.5$ cm corresponds to an inner radius of 4.5 cm. Space-charge effects increase the optimum inner radius to 10 cm for a closed cavity, corresponding to the parameters: $h=15$ cm, $a=10$ cm, $b=35$ cm, $d=25$ cm, $V=1$ MeV, and $I_b=50$ kA.

The simulated extraction apparatus shown in FIGS. 1 and 2 consisted of an annular opening or gap 32 of radial width g in one or both of cavity 26 circular endplates 34 attached to an extraction vacuum coaxial transmission line 36, as shown in FIGS. 1 and 2. Thus, the input power coax 16 and the output coax 36 are concentric and share the middle conductor 24 at radius b. The inner conductor 38 of the extraction vacuum coaxial transmission line 36 was attached to the lower portion of annular cavity 26, but its radius could be varied between the cavity lower radius a and the start of the gap. Thus, the impedance of output coax 36 can be varied independently of the gap g 32. The gap opening and its radial location was a second variable. The gap could also be spanned by conducting wires 42 (FIG. 2) to partially continue cavity wall 34 across gap 32 and to short out the DC component of the beam current and fields. The number of wires and their angular width were third and fourth variables.

Variables 2–4 could affect the resonance by altering the frequency of the desired mode. Moreover, a large extraction opening 32 can perturb the cavity sufficiently that the necessary resonance for the instability is shifted or the desired mode may even cease to exist. Another consideration arises if the desired mode is not the lowest frequency in the cavity; then, other lower frequency modes may grow to disrupt the beam.

When there were no wires 42 across gap 32, cavity 26 acted as an inverse diode, with the bottom of cavity 26 and inner conductor 38 of extraction coax 36 charging to a significant fraction of the beam voltage. This also affected the resonance by lowering the speed of the electrons and raising their transit time across cavity 26. However, it also allowed output coax 36 to carry off and potentially recirculate a significant fraction of any remaining beam energy, thereby increasing overall efficiency. In the simulations, both cavity endplates 34 had identical open gaps 32 (no wires) of width $g=2.5$ cm between radii b-g and b, the inner and outer radii of the output coax, respectively. The microwave output power was 1.6 GW, and the recirculated DC beam energy was 6 GW, for a total efficiency of 4%. When the output gap was increased to $g=10$ cm, the microwave output power remained unchanged at 1.6 GW, but the recirculated DC beam energy increased to 26 GW, raising the overall efficiency to 7%.

When radial wires 42 were placed across the gap, the problem becomes 3D. Cavity gap 32, with wires, was placed on only one end of the cavity, with the other endplate closed off. The number of wires 42 was varied from 8 to 16. The angular width of each wire was varied from ⅛ to ¾ of the spacing between wire centers. Inner conductor 38 of output coax 36 was placed even with the cavity bottom at $a=10$ cm. Cavity output gap g 32 was varied from d/2 to d. There was a tradeoff between opening the cavity to permit extraction and maintaining the cavity mode near resonance. The optimum case was found to be 16 wires, each ½ closed in $\theta$, with cavity gap 32 extending radially all the way from top to bottom of the cavity. The microwave output power was 5 GW, for an efficiency of 10%.

The small-signal theory and computer simulations are in agreement that the RBTO is capable of producing very large microwave power on the order of $10^{10}$ watts. Moreover, it does this at a very low impedance (<10 $\Omega$) while retaining all the other advantages of the ABTO. These characteristics open up new possible applications.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A high power microwave generator comprising:
    a coaxial vacuum transmission line having an outer conductor and an inner conductor;
    said inner conductor having end plates and inner cylindrical surface defining an annular cavity with axial length and radial depth dimensions effective to support a cavity electromagnetic field in a $TEM_{00m}$ mode; and
    a radial field emission cathode formed on said outer conductor for generating an electron beam directed toward said annular cavity electrode.

2. A high power microwave generator according to claim 1, where said annular cavity has a radial depth effective to maximize a growth rate of said cavity electromagnetic field.

3. A high power microwave generator according to claim 1, where at least one of said end plates defines a gap therethrough for outputting microwave radiation from said annular cavity.

4. A high power microwave generator according to claim 2, where at least one of said end plates defines a gap therethrough for outputting microwave radiation from said annular cavity.

5. A high power microwave generator according to claim 3, wherein said gap is spanned by a plurality of conductors to prevent charge buildup on said cylindrical surface.

6. A high power microwave generator according to claim 4, wherein said gap is spanned by a plurality of conductors to prevent charge buildup on said cylindrical surface.

7. A high power microwave generator according to claim 1, where said inner conductor further includes a cylindrical screen between said inner cylindrical surface and said cathode for accelerating said electron beam toward said inner cylindrical surface.

8. A high power microwave generator according to claim 7, where said annular cavity has a radial depth effective to maximize a growth rate of said cavity electromagnetic field.

9. A high power microwave generator according to claim 7, where at least one of said end plates defines a gap therethrough for outputting microwave radiation from said annular cavity.

10. A high power microwave generator according to claim 8, where at least one of said end plates defines a gap therethrough for outputting microwave radiation from said annular cavity.

11. A high power microwave generator according to claim 9, wherein said gap is spanned by a plurality of conductors to prevent charge buildup on said cylindrical surface.

12. A high power microwave generator according to claim 10, wherein said gap is spanned by a plurality of conductors to prevent charge buildup on said cylindrical surface.

* * * * *